(12) United States Patent
Tilleman et al.

(10) Patent No.: US 11,092,647 B2
(45) Date of Patent: Aug. 17, 2021

(54) PROGRAMMABLE INTEGRATED CIRCUIT WITH INTERNAL DIAGNOSTIC HARDWARE

(71) Applicant: HEWLETT PACKARD ENTERPRISE DEVELOPMENT LP, Houston, TX (US)

(72) Inventors: John E. Tilleman, Fort Collins, CO (US); Peter David Maroni, Windsor, CO (US); Erin Hallinan, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 19 days.

(21) Appl. No.: 16/528,500

(22) Filed: Jul. 31, 2019

(65) Prior Publication Data

US 2021/0033673 A1   Feb. 4, 2021

(51) Int. Cl.
| | |
|---|---|
| *G01R 31/3185* | (2006.01) |
| *H03K 19/177* | (2020.01) |
| *G01R 31/319* | (2006.01) |
| *G01R 31/3187* | (2006.01) |
| *H03K 19/17728* | (2020.01) |
| *H03K 19/1776* | (2020.01) |

(52) U.S. Cl.
CPC . *G01R 31/318516* (2013.01); *G01R 31/3187* (2013.01); *G01R 31/31905* (2013.01); *H03K 19/1776* (2013.01); *H03K 19/17728* (2013.01)

(58) Field of Classification Search
CPC ........ G01R 31/318516; G01R 31/3187; G01R 31/31905; H03K 19/17728; H03K 19/1776
See application file for complete search history.

(56) References Cited

U.S. PATENT DOCUMENTS

| | | | |
|---|---|---|---|
| 5,444,583 A | 8/1995 | Ehrlich et al. | |
| 5,469,545 A * | 11/1995 | Vanbuskirk | ......... G06F 13/4022 |
| | | | 370/235 |
| 6,122,693 A | 9/2000 | Gutta et al. | |
| 6,625,688 B1 | 9/2003 | Fruehling et al. | |
| 6,760,865 B2 | 7/2004 | Ledford et al. | |
| 7,103,530 B1 * | 9/2006 | Bartz | .................... G06F 11/261 |
| | | | 703/27 |
| 7,133,822 B1 * | 11/2006 | Jacobson | ............ G06F 11/2294 |
| | | | 703/28 |

(Continued)

FOREIGN PATENT DOCUMENTS

KR       20130128424      11/2013

*Primary Examiner* — Kyle Vallecillo
(74) *Attorney, Agent, or Firm* — Nolte Lackenbach Siegel

(57) ABSTRACT

A programmable integrated circuit may include logic, signal select hardware, programmable signal analysis hardware, an embedded microcontroller, and a hardware interface. The logic performs one or more functions and outputs a plurality of signals. The signal select hardware selects one or more of the signals output from the logic. The programmable signal analysis hardware analyzes the selected signals to produce diagnostic data. The embedded microcontroller receives the diagnostic data from the programmable signal analysis hardware and may reconfigure the logic based on the diagnostic data. The hardware interface connects the programmable signal analysis hardware and the embedded microcontroller to transport the diagnostic data.

20 Claims, 14 Drawing Sheets

(56) References Cited

U.S. PATENT DOCUMENTS

| | | | | |
|---|---|---|---|---|
| 7,324,535 | B1* | 1/2008 | Goss | H04L 45/50 370/230 |
| 2005/0071719 | A1* | 3/2005 | Faust | G01R 31/318544 714/741 |
| 2016/0337257 | A1* | 11/2016 | Yifrach | H04L 47/6205 |
| 2017/0343601 | A1* | 11/2017 | Casatuta | G01R 31/31724 |

* cited by examiner

PROGRAMMABLE INTEGRATED CIRCUIT WITH INTERNAL DIAGNOSTIC HARDWARE

BACKGROUND

Integrated circuits ("ICs"), such as Application Specific Integrated Circuits ("ASICs"), are used in many different types of products for many different functions. For example, some modern technologies that rely on ASICs include, but are not limited to, transceiver technology, cloud computing, Internet of Thing ("IoT") devices, artificial intelligence and machine learning, etc. Moreover, it may be useful to monitor and manage the performance of these ASICs during operation.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion. Features of the present disclosure are illustrated by way of example and not limited in the following figures, in which like numerals indicate like elements, in which.

DETAILED DESCRIPTION

Figure 1:
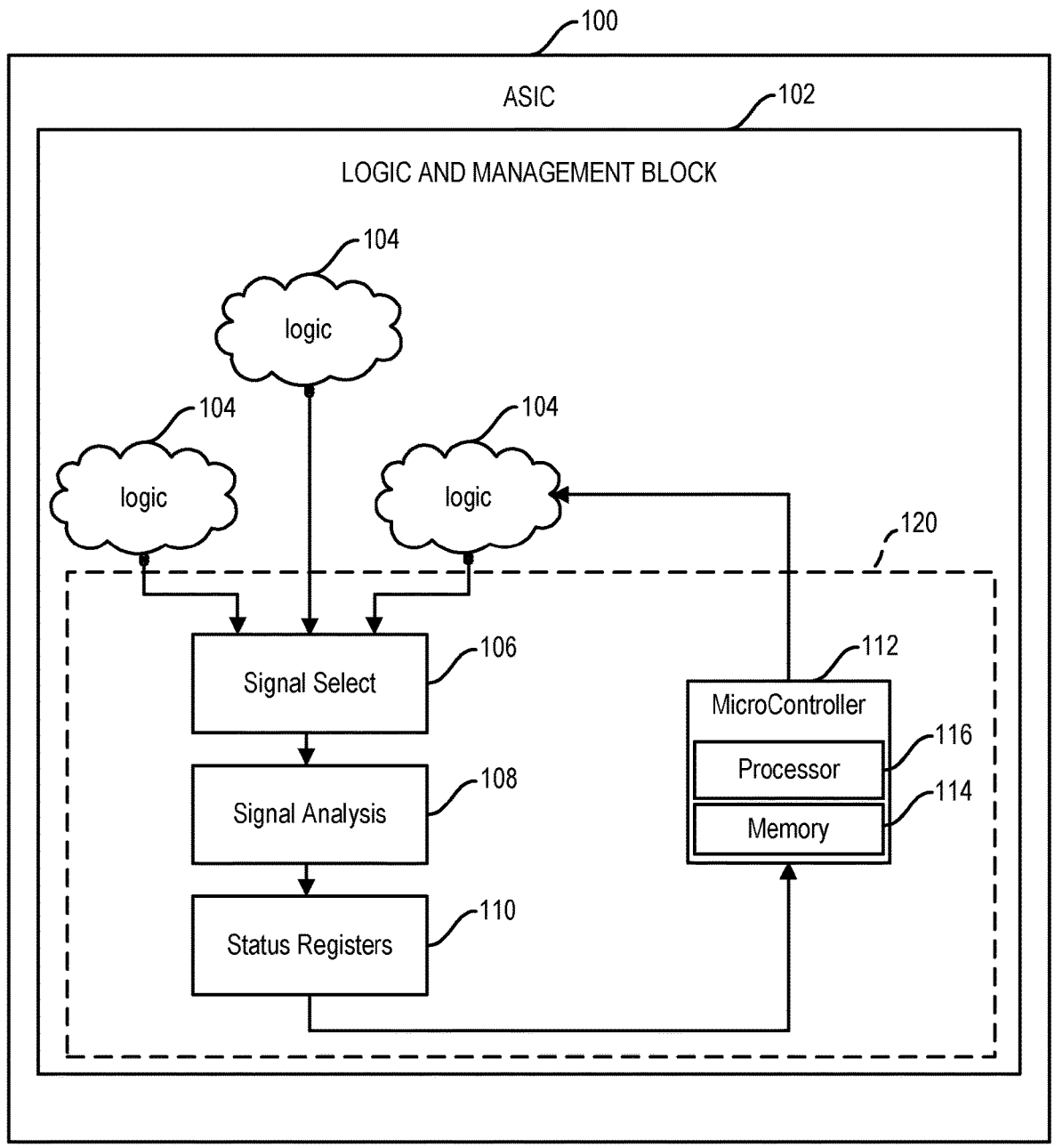
FIG. 1 depicts a programmable integrated circuit with diagnostic hardware, according to one or more examples of the present disclosure.

ICs, such as ASICs, may be monitored and managed using software and/or hardware external to the IC. For example, an ASIC may include a sideband interface slave port for device configuration, management, and runtime status and monitoring functions. This sideband interface may be defined by a proprietary physical/logical protocol or by an industry standard, such as Peripheral Component Interconnect Express (PCIe). A processor, such as a microprocessor or a Baseboard Management Controller (BMC), may initiate transactions over this sideband interface to monitor and manage the ASIC. However, such external monitoring and management is limited by the speed of the sideband interface. Accordingly, as speed and performance expectations increase for ASICs, external monitoring and management may become insufficient and/or cost-prohibitive.

Disclosed herein are programmable ICs with diagnostic hardware. Further disclosed herein are systems that include one or more programmable ICs with diagnostic hardware. Further disclosed herein is a method for performing internal diagnostics for a programmable IC. Diagnostic hardware being internal to the IC allows the IC to be monitored, errors addressed, and performance tuned at the speed of the IC. Moreover, including an embedded microcontroller and other programmable hardware as part of the diagnostic hardware of the IC enables performance settings for the IC to be dynamically optimized in ways that may be geared toward specific workloads and customer demands without hardware changes to the IC.

In one example implementation, depicted for instance in FIGS. 1-8, a programmable integrated circuit includes logic, signal select hardware, programmable signal analysis hardware, an embedded microcontroller, and a hardware interface. The logic is to perform one or more functions and output a plurality of signals. The signal select hardware is to select one or more of the signals output from the logic. The programmable signal analysis hardware is to analyze the selected signals to produce diagnostic data. The embedded microcontroller is to receive the diagnostic data from the programmable signal analysis hardware and may reconfigure the logic based on the diagnostic data. The hardware interface connects the programmable signal analysis hardware and the embedded microcontroller to transport the diagnostic data.

"Diagnostic data" includes any information provided by the signal analysis hardware that may be used by the embedded microcontroller to reconfigure the logic. In one example, the diagnostic data include raw data that may be written to a status register or to memory of the embedded microcontroller for use by the embedded microcontroller to determine whether and how to reconfigure the logic. The "raw data" indicates status of the logic such as relates to performance, errors, etc. In another example, the diagnostic data includes interrupt data or information, for instance in the form of interrupt signals, that may cause or trigger the embedded microcontroller to stop a current processing routine and begin one or more other processing routines to determine whether and how to reconfigure the logic.

In another example implementation, depicted for instance in FIGS. 9-13, a system includes plurality of programmable integrated circuits. Each programmable integrated circuit includes hardware to communicatively couple to at least one other programmable integrated circuit, one or more logic blocks, a management block communicatively coupled to the one or more logic blocks, and programmable signal analysis hardware. The one or more logic blocks include logic to perform one or more functions, wherein the logic outputs a plurality of signals, and signal select hardware to select one or more of the signals output from the logic. The management block includes an embedded microcontroller to receive diagnostic data and reconfigure the logic based on the diagnostic data. The programmable signal analysis hardware is to analyze the selected signals from the one or more and generate the diagnostic data.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Turning now to the drawings, FIG. 1 depicts a programmable integrated circuit, in this case an ASIC, 100 with diagnostic hardware, according to one or more examples of the present disclosure. The example ICs depicted in the accompanying FIGS. 1-13 are referred to as ASICs. However, the present teachings are applicable to any ICs whether designed or used for a general-purpose or for a specific purpose. An "integrated circuit" or "IC" refers to a plurality of electronic and/or electrical components included on the same semiconductor chip and interconnected to perform one or more functions. Electronic and/or electrical components may include circuit elements such as transistors, resistors, and capacitors, and/or more complex components that may be constructed using the circuit elements, such as status registers, embedded microcontrollers, interfaces, configurable logic, and other hardware formed on the IC using any suitable manufacturing or fabrication technique, such as a semiconductor fabrication technique. A "programmable" IC includes at least one electrical or electronic component that may have its functionality adjusted after manufacturing. An "ASIC" refers to an IC customized for a particular use, such as an optical and/or electrical transceiver ASIC.

Figure 2:
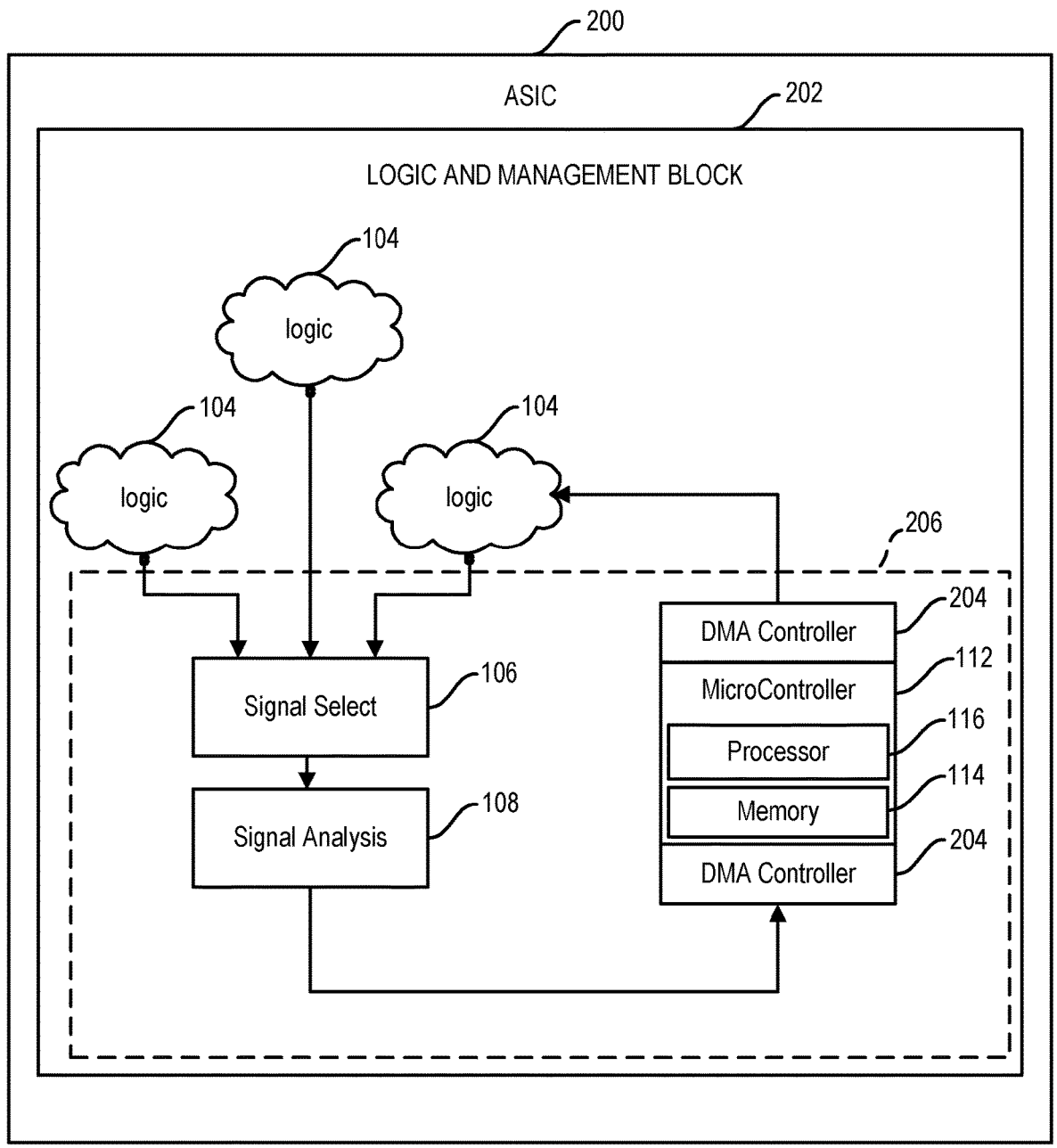
FIG. 2 depicts a programmable integrated circuit with diagnostic hardware, according to one or more examples of the present disclosure.

Moreover, an IC may be subdivided into a plurality of IC blocks, or simply blocks. A "block" refers to a separate grouping of the electrical and/or electronic components of the IC. The components may be grouped based on function, physical proximity, or both, for example. Two or more blocks may have the same or different logic functionality and may or may not directly communicate with each other but may be communicatively coupled to and monitored and managed by yet another block of the IC. An IC that does not have two or more blocks is referred to herein as having a single block. Single-block ICs are depicted in FIGS. 1 and 2.

As illustrated in FIG. 1, ASIC 100 includes a logic and management block 102 that includes logic 104 and diagnostic hardware 120 that may be used to monitor and reconfigure the logic 104. As illustrated, the diagnostic hardware 120 includes signal select hardware 106, signal analysis hardware 108, one or more status registers 110, and a microcontroller 112. The components 104-112 of the ASIC 100 may be communicatively coupled (as indicated by the lines therebetween) using any suitable hardware including, but not limited to, signal traces on the ASIC, interfaces within or between the components, a computer bus or simply bus (not shown), intervening components (not shown), etc.

The logic 104 represents hardware, such as programmable gate arrays and other configurable logic, which may collectively perform one or more functions depending, for instance, on the purpose of the ASIC 100. For example, for a transceiver ASIC, the logic 104 may function to transmit and receive optical, electrical, and/or telecommunication signals for high-speed computer network and telecommunication links that use optical fiber and may output a plurality of such signals, which may be one or more digital signals. However, the logic 104 may perform other functions determined, at least in part, based on the intended use of the ASIC 100.

The signal select hardware 106 may include a programmable multiplexer (not otherwise shown), as one example, which may be programmed to select one or more of the signals output from the logic 104. The one or more signals may allow operational status of the logic 104 to be detected and analyzed. Operational status may include, for instance, performance, such as speed and efficiency, and errors or faults.

The signal analysis hardware 108 may be programmed to analyze the selected signals, for instance data from or indicated by or in the selected signals, and output results based on that analysis. The analysis may, for instance, detect conditions relevant to performance and correct functioning of the logic 104 and/or its interfaces. In a particular example, the signal analysis hardware 208 includes a plurality of criteria and pattern-matching registers that allow data retrieved from the selected signals to be compared to one or more programmed criteria. The criteria may include, for example, pattern-matching type and pattern-match value. The pattern-matching type may indicate a type of comparison to be performed, e.g., equal to, greater than, less than. The pattern-matching value may indicate one or more values to which retrieved data is compared using the pattern-matching type. In an example, the signal analysis hardware 108 may monitor for certain conditions of interest based on defined goals for operation and/or performance of the logic 104.

The signal analysis hardware 108 may record results of the analysis as diagnostic data in one or more status registers 110. The status registers 110 are hardware registers that may be accessed by the microcontroller 112. For example, if one or more (pattern-matching) criteria are satisfied, the signal analysis hardware 108 may store the value of the data retrieved from the selected signals or some other value related to the retrieved data, as the diagnostic data, in the status registers 110. The diagnostic data may be used by the microcontroller 112 to determine whether and how to reconfigure the logic 104 to, for instance, improve performance of the logic 104 or address faults or errors indicated in the operation of the logic 104.

The signal analysis hardware 108 and the microcontroller 112 may use a register interface (not shown) to access the status registers 110. For example, the signal analysis hardware 108 may use a memory-mapped input address or port-mapped input address with programmable a "store" $_{[HE1]}$instruction to write to the status registers 110. Similarly, the microcontroller 112 may use a memory-mapped output address or port-mapped output address with a programmable "load" instruction to read from the status registers 110. In another example, the "store" and "load" instructions are not executed, and the signal analysis hardware 108 stores the results of the signal analysis directly into the status registers 110, which may be indirectly or directly mapped into the memory 114. Accordingly, in this illustrated example, the one or more status registers 110 (and corresponding register interfaces) serves as a hardware interface connecting the programmable signal analysis hardware 108 and the microcontroller 112 to transport the diagnostic data.

The microcontroller 112 is an "embedded" microcontroller meaning that it is included as an internal diagnostic component on the ASIC 100. The microcontroller 112 includes a processor 116 and a memory 114. In an example, the processor 116 is a hardware processor that may contain one or more processor cores. For example, the processor 116 may be a central processing unit that may execute instructions, for instance in the form of microcode or other machine or low-level code, stored in the memory 114. The memory 114 is a non-transitory storage medium, which may be implemented using one or more types of memory including, but not limited to, one or more or a combination of, random-access memory ("RAM"), read-only memory ("ROM"), electrically erasable programmable read-only memory ("EEPROM"), flash memory, memory buffers, and/or status registers.

Upon retrieving the diagnostic data from the status registers 110, the microcontroller 112 may use its processor 116 executing microcode (not otherwise shown) contained in its memory 114 to process the diagnostic data to reconfigure the logic 104 to correct its operation or improve its performance based on the diagnostic data. For example,$_{[HE2]}$ the microcontroller 112 may store certain bits or flagged values to control registers (not shown) within its memory 114 that indicate actions to be taken by the logic 104 to correct operation or improve performance, thereby reconfiguring the logic 104. In another example, reconfiguring the logic 104 may include resetting the logic 104. The logic 104 may access the bits using a register interface to registers of the memory 114. Alternatively, the microcontroller 112 may store these bits or flagged values to one or more control registers (not shown) of the logic 104 that the logic 104 may access using a register interface to reconfigure itself.

The control registers may be directly or indirectly mapped into microcontroller memory, and the register interface may be implementation specific. One register interface implementation connects, e.g., glues, a Advances High-performance Bus ("AHB") to a proprietary register bus. Another register interface implementation uses a proprietary daisy chain to access registers that are located more remotely within the ASIC.

In one example, the control registers could adjust settings to enable/disable assorted behaviors and features, tune performance or electrical settings, reset some portion of the logic 104, shut off a malfunctioning link, etc. In another example, there could be an instance where the signal select hardware 106 and the signal analysis hardware 108 were observing queue depths in a given piece of logic 104. The signal analysis hardware 108 may be configured to match on conditions indicating queues are overfilled or underfilled. The result may be stored in the status registers 110. The microcontroller 112 may learn about the overfill/underfull when it reads the status registers 110. The microcontroller may then adjust control register settings in the logic 104 to slow down or speed up release of flow control credits. Making these adjustments may optimize performance of the logic 104 and avoid unhealthy conditions (like overfilling) which might cause data to be lost.

FIG. 2 depicts a programmable ASIC 200 with diagnostic hardware 206, according to one or more examples of the present disclosure. ASIC 200 includes a logic and management block 202 that includes logic 104 and the diagnostic hardware 206, which may be used to monitor and reconfigure the logic 104. As illustrated, the diagnostic hardware 206 includes signal select hardware 106, signal analysis hardware 108, two direct memory access ("DMA") controllers 204, and a microcontroller 112 having a processor 116 and memory 114. The components 104-108, 112, and 204 of the ASIC 200 may be communicatively coupled (as indicated by the lines therebetween) using any suitable hardware including, but not limited to, signal traces on the ASIC, interfaces within or between the components, buses, intervening components, etc.

In the example ASIC 200, the logic 104, signal select hardware 106, signal analysis hardware 108, and microcontroller 112 may be similarly implemented as described above by reference to FIG. 1. However, in this example, a DMA controller 204 serves as the hardware interface connecting the signal analysis hardware 108 and the microcontroller 112 to transport the diagnostic data generated by the signal analysis hardware 108 to the microcontroller 112. More particularly, the signal analysis hardware 108 may format the diagnostic data to be compatible with the memory 114. The DMA controller 204 may then control the transfer of the diagnostic data from the signal analysis hardware 108 directly into the memory 114 of the microcontroller 112. For example, the diagnostic data may be written to a dedicated buffer in the memory 114.

Upon retrieving the diagnostic$_{[HE3]}$ data from the memory 114, the microcontroller 112 may use its processor 116 executing microcode contained in its memory 114 to process the diagnostic data to reconfigure the logic 104 to correct its operation or improve its performance. In one example, once processing of the diagnostic data is complete, the microcontroller 112, generates additional microcode to implement the desired reconfiguration and writes the additional microcode to another buffer in the memory 114. A second DMA controller 204 coupled between the microcontroller 112 and the logic 104 controls access by the logic 104 to retrieve the generated microcode to carry out the reconfiguration based on the diagnostic data.

Using the DMA controllers 204 may create a higher bandwidth hardware interface that allows transporting more data with less delay than with the hardware interface implemented using the status registers 110 and corresponding register interfaces. In an example of tuning electrical settings, data arriving on a high speed link may be directly stored into memory 114. The microcontroller 112 may recognize patterns in the data, which would lead settings to be tuned, for instance adjusting filter coefficients for the logic 104 if the data suggests that high speed edges are being lost. Allowing the logic 104 to directly retrieve coefficients from memory 114 allows latency to be reduced from multiple processing cycles to a single processing cycle.

FIGS. 3-8 illustrates different examples of the logic 104 and at least some of the diagnostic hardware for the logic 104 being distributed over multiple logic blocks of an ASIC, with the microcontroller 112 residing in a separate management block of the ASIC. Using these example arrangements, the microcontroller 112 may process diagnostic data received from each logic block and may coordinate reconfiguring the logic 104 within each logic block to enhance and/or correct functioning of the ASIC as a whole. Moreover, only two logic blocks and one management block are shown in each ASIC. However, other examples according to the present teachings may contain additional logic and/or management blocks. A "logic" block contains at least part of the logic 104 being monitored and managed, and a "management" block contains at least the microcontroller 112.

Figure 3:
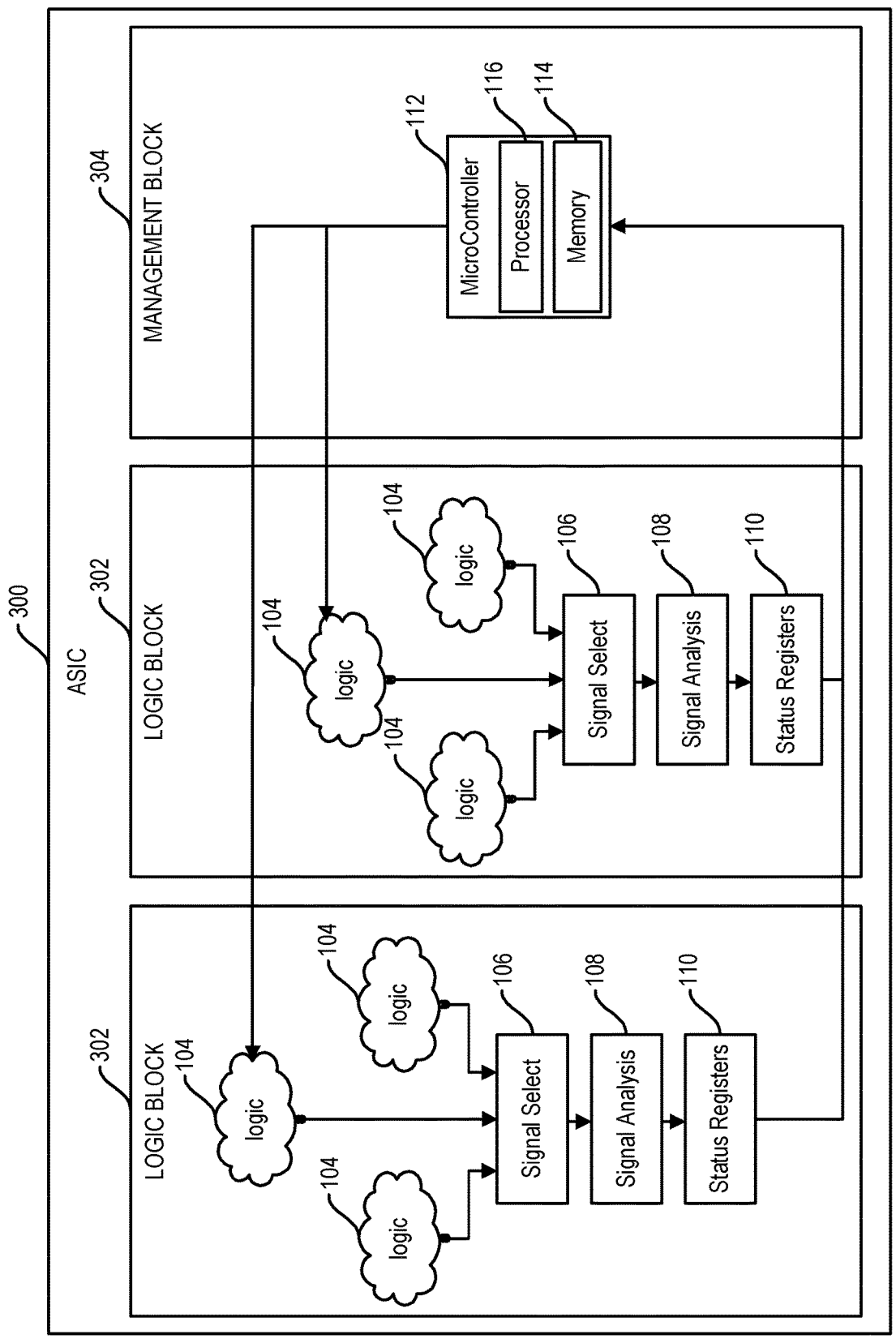
FIG. 3 depicts a programmable integrated circuit with diagnostic hardware, according to one or more examples of the present disclosure.

More particularly, FIG. 3 depicts a programmable ASIC 300 that includes two logic blocks 302 and a management block 304. Each logic block 302 contains logic 104 and diagnostic hardware that includes signal select hardware 106, signal analysis hardware 108, and status registers 110. The management block 304 includes a microcontroller 112 having a processor 116 and memory 114. The components 104-112 of the ASIC 300 may be communicatively coupled (as indicated by the lines therebetween) using any suitable hardware including, but not limited to, signal traces on the ASIC, interfaces within or between the components, buses, intervening components, etc. Additionally, the logic 104, signal select hardware 106, signal analysis hardware 108, status registers 110, and microcontroller 112 may be similarly implemented as described above by reference to FIG. 1.

Figure 4:
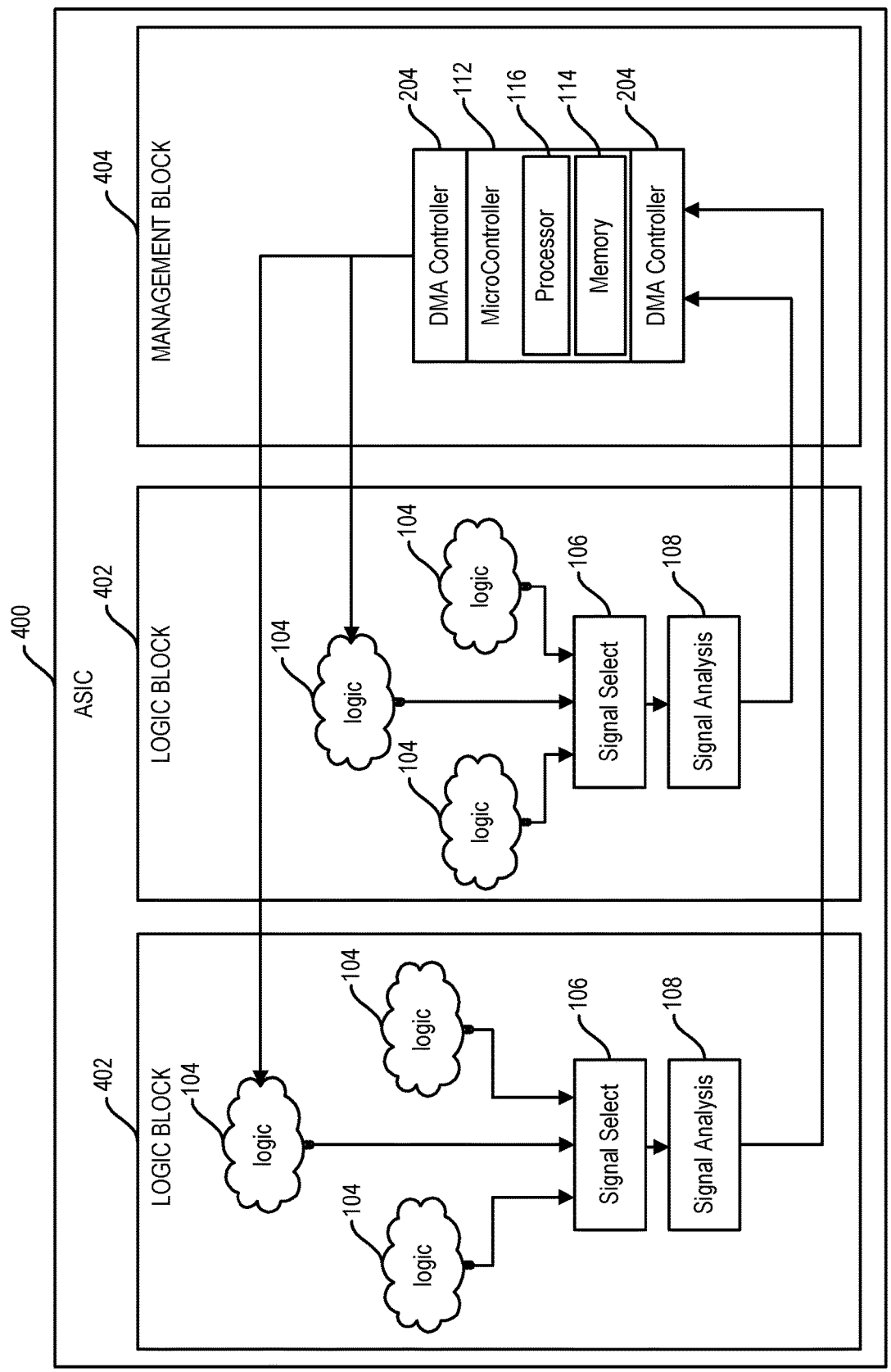
FIG. 4 depicts a programmable integrated circuit with diagnostic hardware, according to one or more examples of the present disclosure.

FIG. 4 depicts a programmable ASIC 400 that includes two logic blocks 402 and a management block 404. Each logic block 402 contains logic 104 and diagnostic hardware that includes signal select hardware 106 and signal analysis hardware 108. The management block 304 includes a microcontroller 112 having a processor 116 and memory 114 and two DMA controllers 204 serving as hardware interfaces between the microcontroller 112 and the signal analysis hardware 108 and logic 104. The components 104-108, 112, and 204 of the ASIC 400 may be communicatively coupled (as indicated by the lines therebetween) using any suitable hardware including, but not limited to, signal traces on the ASIC, interfaces within or between the components, buses, intervening components, etc. Additionally, the logic 104, signal select hardware 106, signal analysis hardware 108, microcontroller 112, and DMA controllers 204 may be similarly implemented as described above by reference to FIGS. 1 and 2.

Figure 5:
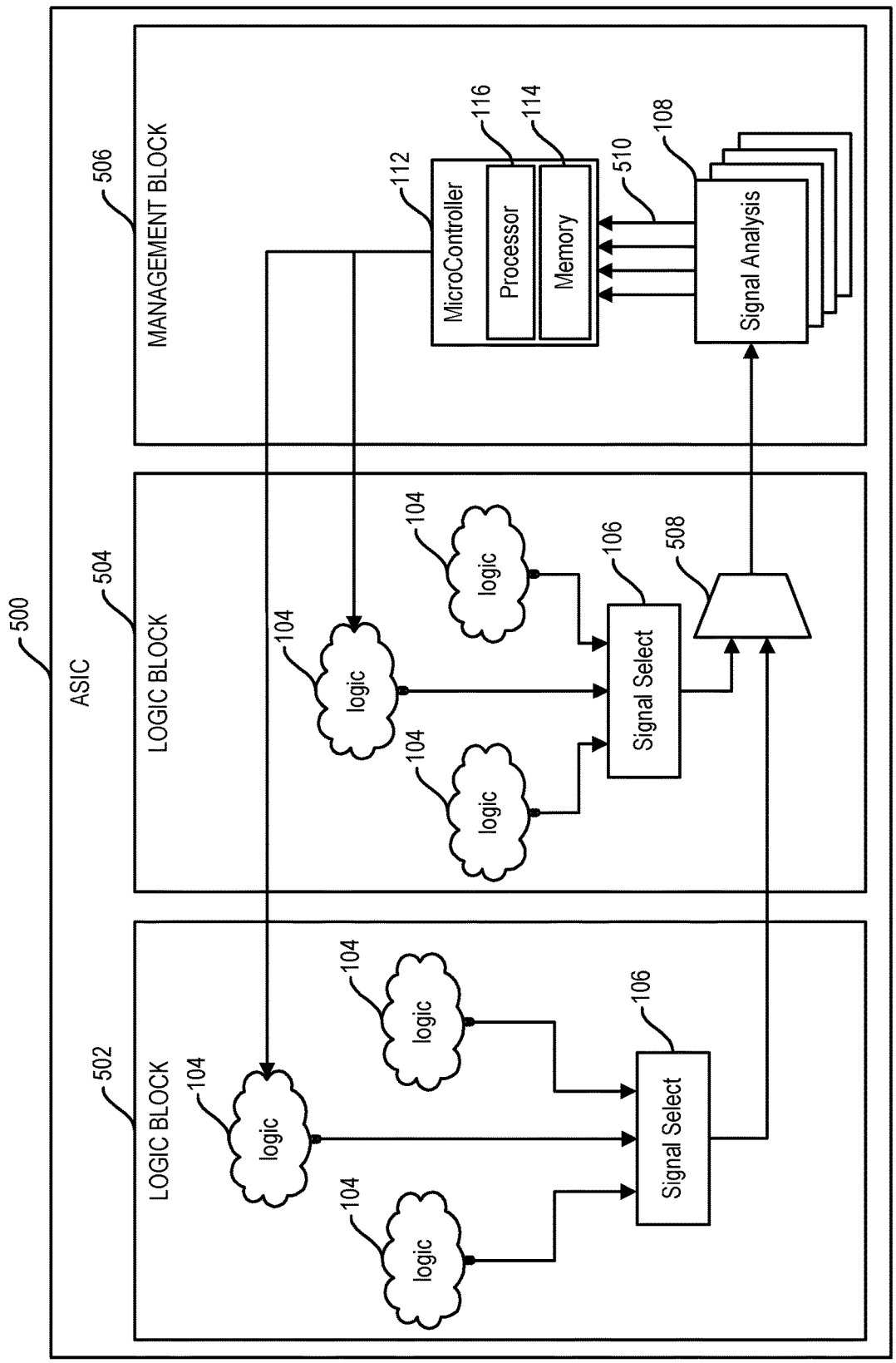
FIG. 5 depicts a programmable integrated circuit with diagnostic hardware, according to one or more examples of the present disclosure.

FIG. 5 depicts a programmable ASIC 500 that includes two logic blocks 502, 504 and a management block 506. Each logic block 502, 504 contains logic 104 and diagnostic hardware that includes signal select hardware 106. The management block 304 includes a microcontroller 112 having a processor 116 and memory 114 and signal analysis hardware 108. The components 104-108 and 112 of the ASIC 500 may be communicatively coupled (as indicated by the lines therebetween) using any suitable hardware including, but not limited to, signal traces on the ASIC, interfaces within or between the components, buses (such as a bus with a multiplexer 508), intervening components, etc.

The logic 104, signal select hardware 106, signal analysis hardware 108, and microcontroller 112 may be similarly implemented as described above by reference to FIG. 1. However, the hardware interface between the signal select hardware 106 and the signal analysis hardware 108 and the hardware interface between the signal analysis hardware 108 and the microcontroller 112 may be implemented differently. As illustrated, the bus 508 couples between the signal select hardware 106 of the logic blocks 502, 504 and the signal analysis hardware 108 contained in the management block 506. In a particular example, the signal analysis hardware 108 may contain dedicated signal analysis hardware for each logic block (as depicted by the multiple signal analysis blocks), wherein the diagnostic data from each logic block 502, 504 maybe be programmably multiplexed onto the bus 508 for providing to the respective dedicated signal analysis hardware 108.

As further illustrated, the hardware interface between the signal analysis hardware 108 and the microcontroller 112 is a direct connection that allows the signal analysis hardware 108 to send interrupt data 510, as the diagnostic data, to the microcontroller 112. The interrupt data 510 represents conditions that cause the microcontroller 112 to interrupt any current processing routines, e.g., executable instructions, and to execute one or more routines associated with the particular interrupts data that was received, in order to reconfigure the logic 104 in one or both of the logic blocks 502, 504.

Figure 6:
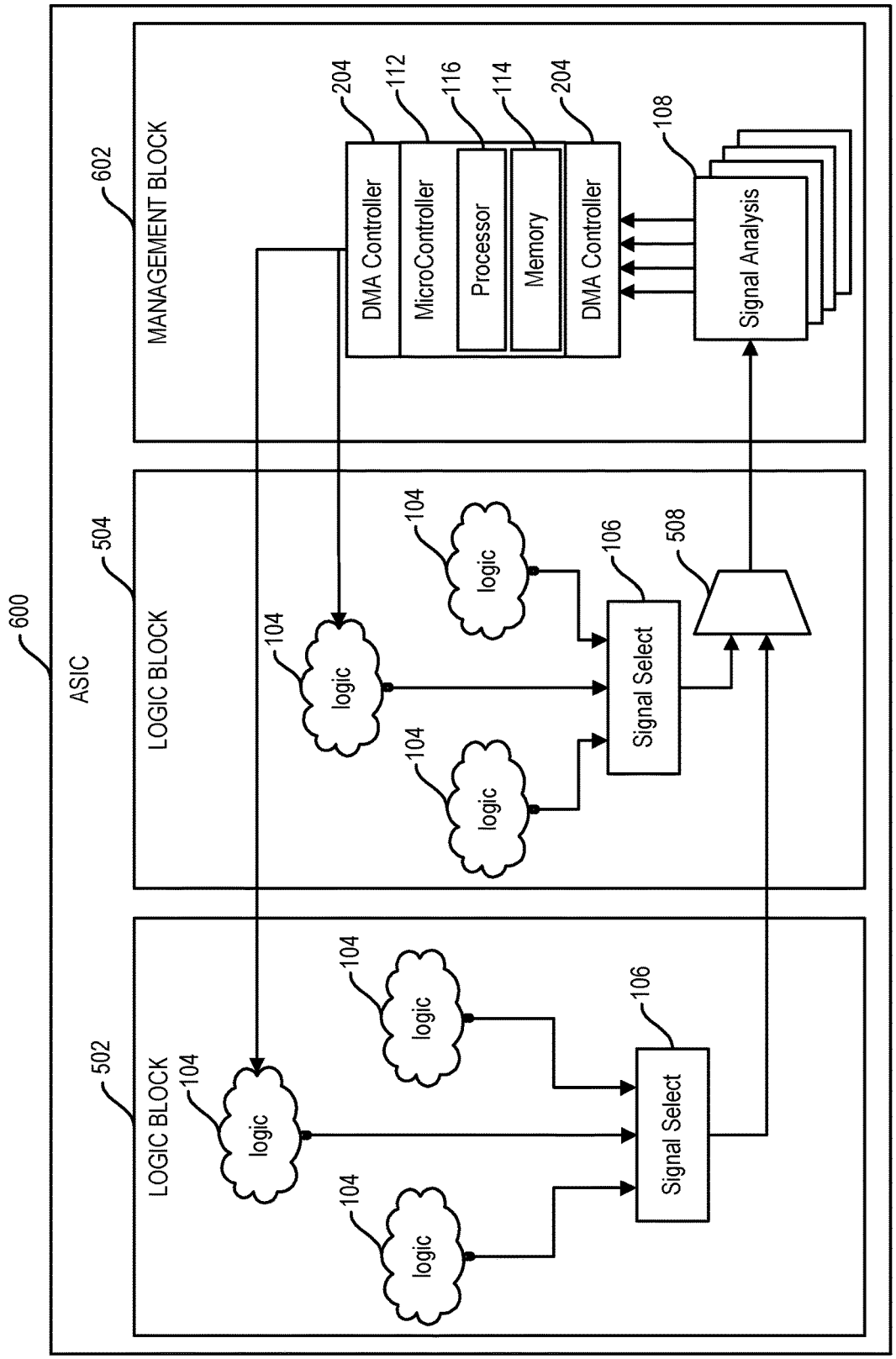
FIG. 6 depicts a programmable integrated circuit with diagnostic hardware, according to one or more examples of the present disclosure.

FIG. 6 depicts a programmable ASIC 600 that includes two logic blocks 502, 504 and a management block 602. Each logic block 502, 504 contains logic 104 and diagnostic hardware that includes signal select hardware 106. The management block 304 includes a microcontroller 112 having a processor 116 and memory 114, signal analysis hardware 108, and DMA controllers 204 serving as hardware interfaces between the microcontroller 112 and the signal analysis hardware 108 and logic 104. The signal selects hardware 106 and signal analysis hardware 108 are coupled by a bus 508. The components 104-108, 112, 204, and 508 of the ASIC 600 may be communicatively coupled (as indicated by the lines therebetween) using any suitable hardware including, but not limited to, signal traces on the ASIC, interfaces within or between the components, buses, intervening components, etc. Additionally, the logic 104, signal select hardware 106, signal analysis hardware 108, microcontroller 112, DMA controllers 204, and bus 508 may be similarly implemented as described above by reference to FIGS. 1, 2, and 5.

Figure 7:
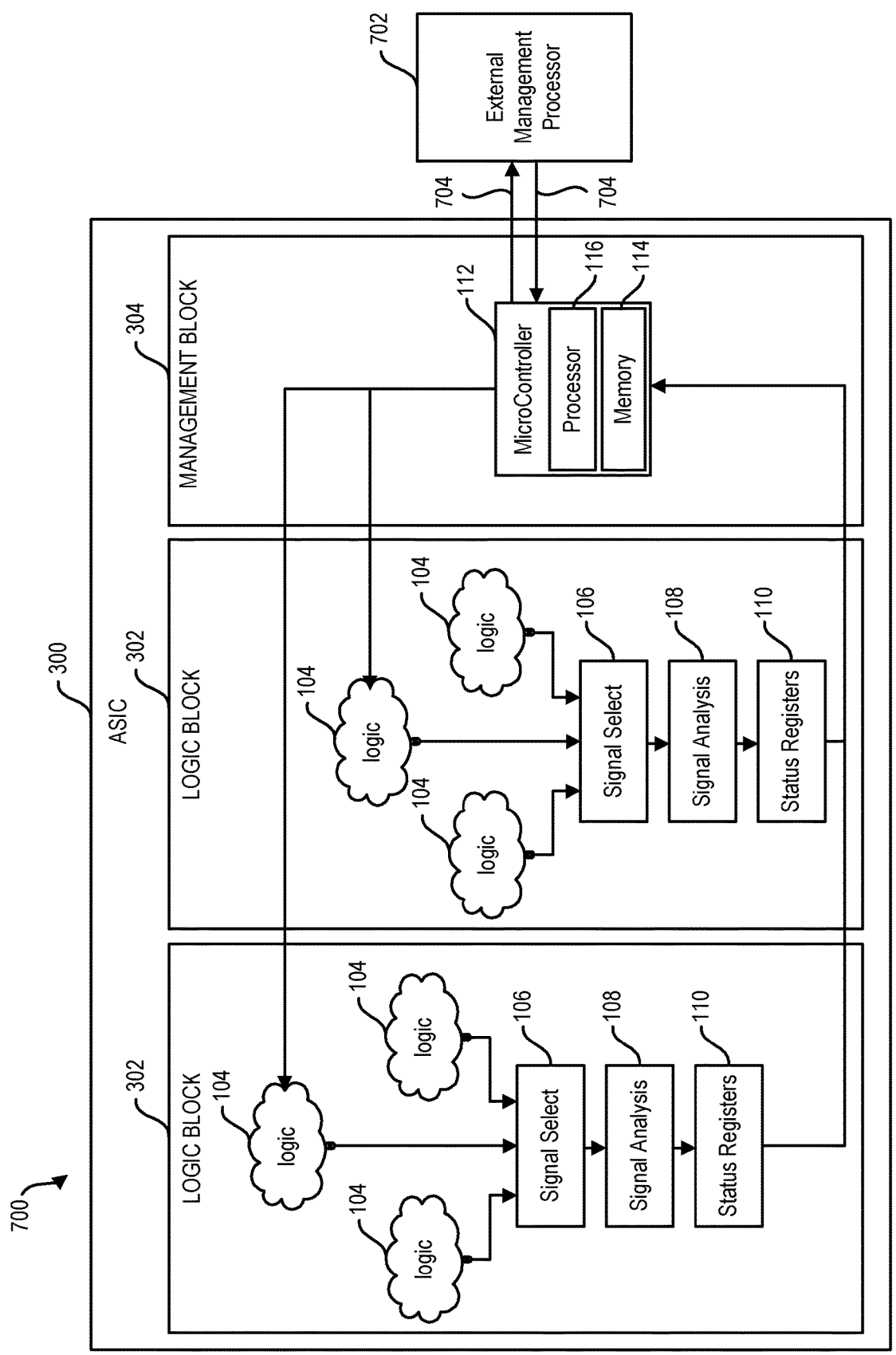
FIG. 7 depicts a system that includes a programmable integrated circuit with diagnostic hardware, according to one or more examples of the present disclosure.
Figure 8:
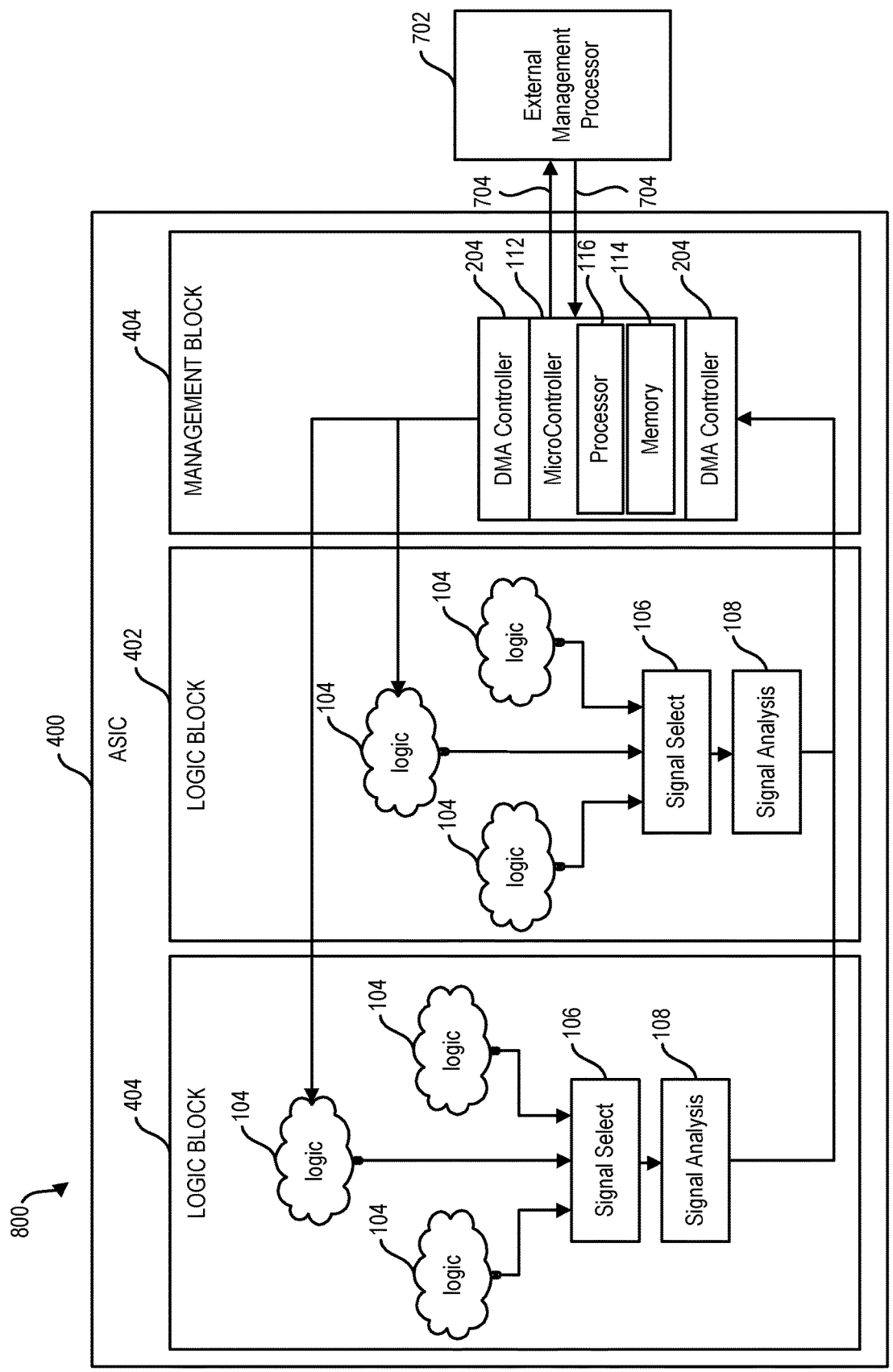
FIG. 8 depicts a system that includes a programmable integrated circuit with diagnostic hardware, according to one or more examples of the present disclosure.

FIGS. 7 and 8 depict systems that include an ASIC with internal diagnostic hardware that may be further managed by an external management processor. Such arrangements may be used in systems that may coordinate the functioning of the ASIC with other components, ICs, etc., of a larger system. Particularly, FIG. 7 depicts a system 700 that includes the programmable ASIC 300 with diagnostic hardware (as illustrated in FIG. 3) communicatively coupled to an external management processor 702. The management processor 702 may be implemented as a CPU of the larger system 700 or as one of multiple microcontrollers, for instance, within the larger system 700. FIG. 8 depicts a system 800 that includes the programmable ASIC 400 with diagnostic hardware (as illustrated in FIG. 4) communicatively coupled to an external management processor 702.

As shown, a hardware interface 704 couples the microcontroller 112 and the external management processor 702. In an example, the hardware interface 704 includes a connection between general purpose input/output ("GPIO") pins (not shown) included on both the microcontroller 112 and the external management processor 702. In some examples, the external management processor 702 may be used, for instance, to manage thermal events and/or catastrophic errors that may impact the ASIC. In another example, logic 104 management and reconfiguration responsibilities may be distributed across the microcontroller 112 and the external management processor 702 to coordinate reconfiguring the logic 104 in view of an more complex system that may include the systems 800, 900. Moreover, the external management processor 702 may be used to initialize, program, and/or reprogram the microcontroller 112.

Figure 9:
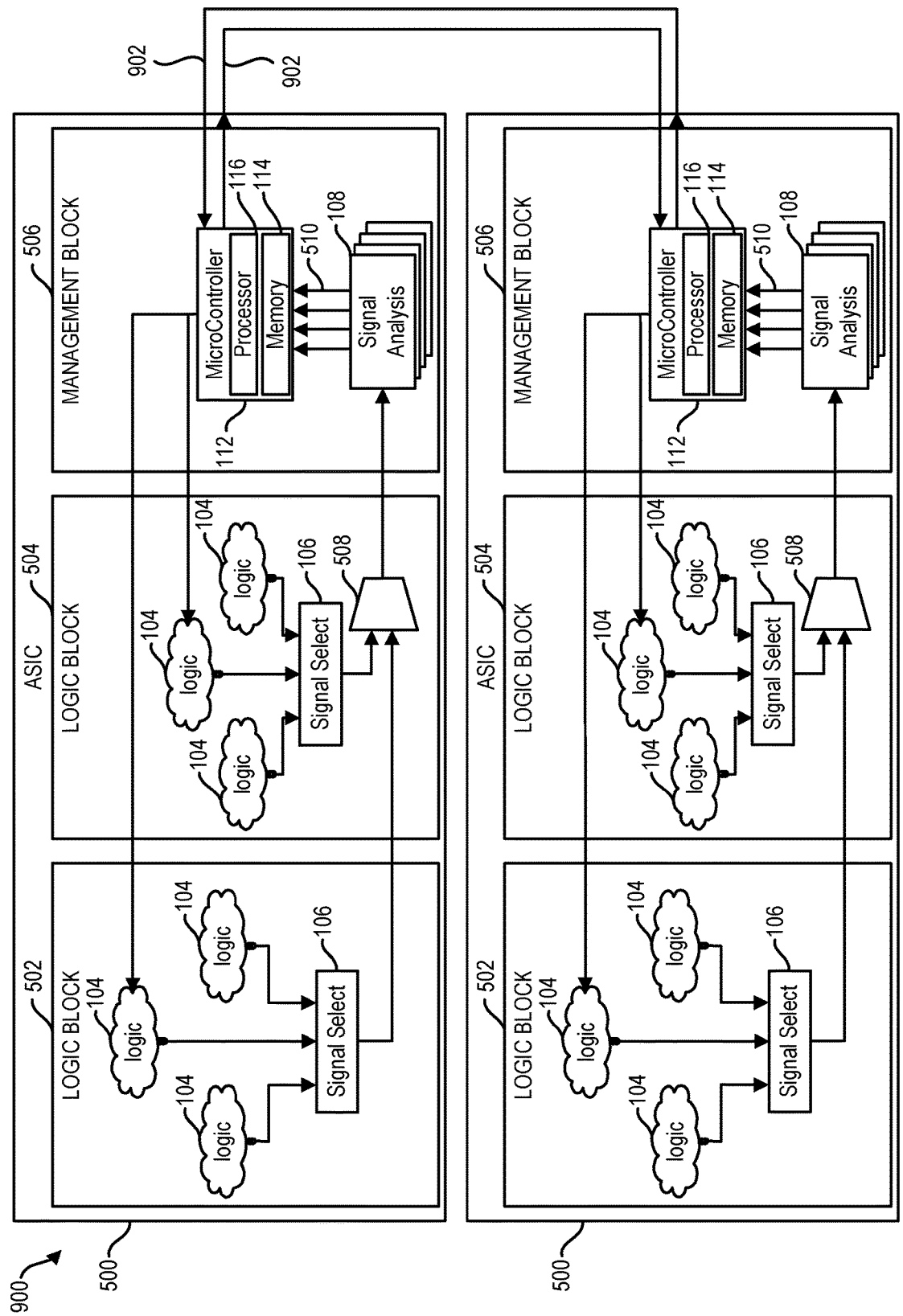
FIG. 9 depicts a system that includes multiple programmable integrated circuits with diagnostic hardware, according to one or more examples of the present disclosure.

FIGS. 9-13 depicts systems that include multiple ASICs having internal diagnostic hardware and that include hardware to communicatively couple each ASIC to at least one other ASIC of the system. Only two ASICs are shown in each system. However, other example systems according to the present teachings may contain additional ASICs with additional blocks. More particularly, FIG. 9 depicts a system 900 that includes two programmable ASICs 500 as depicted in FIG. 5. As illustrated, a hardware interface 902 couples the microcontrollers 112. In an example, the hardware interface 902 includes a connection between GPIO pins (not separately shown) included on both microcontrollers 112 to coordinate configuring the logic 104 across both ASICs 500.

Figure 10:
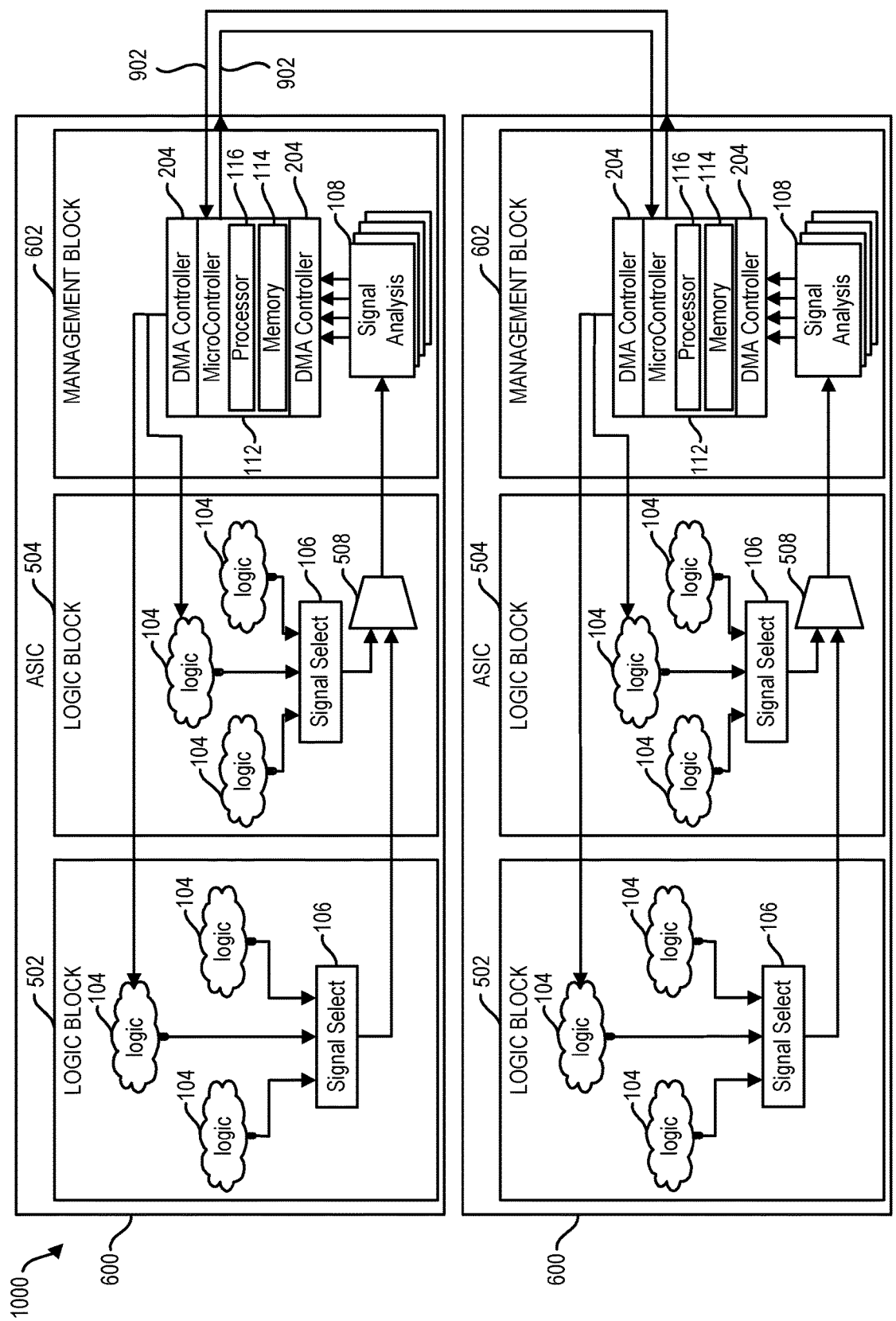
FIG. 10 depicts a system that includes multiple programmable integrated circuits with diagnostic hardware, according to one or more examples of the present disclosure.

FIG. 10 depicts a system 1000 that includes two programmable ASICs 600 as depicted in FIG. 6. As illustrated, a hardware interface 902 couples the microcontrollers 112. In an example, the hardware interface 902 includes a connection between GPIO pins (not shown) included on both microcontrollers 112 to coordinate configuring the logic 104 across both ASICs 600.

Figure 11:
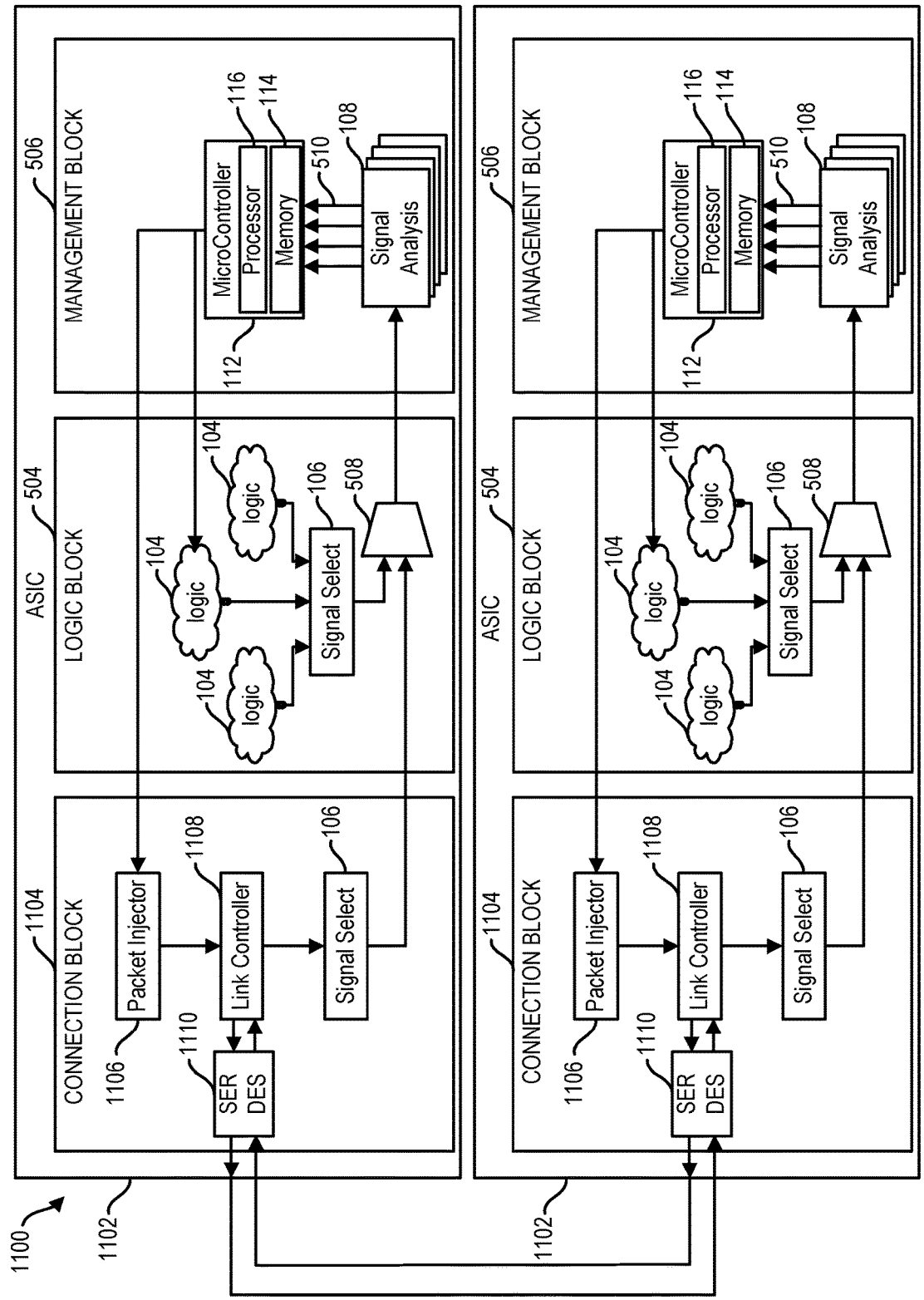
FIG. 11 depicts a system that includes multiple programmable integrated circuits with diagnostic hardware, according to one or more examples of the present disclosure.

FIG. 11 depicts a system 1100 that includes multiple programmable ASICs 1102 with diagnostic hardware, according to one or more examples of the present disclosure. In this example system, each ASIC 1102 includes a logic block 504 and management block 506, as described above by reference to FIGS. 1 and 5. Each ASIC 1102 further includes a connection block 1104 containing hardware to communicatively couple to the other programmable ASIC 1102. In general, the hardware on connection block 1104 contains connection hardware that may: receive configuration data from the microcontroller 112 of the respective ASIC 1102 to provide to the connection block 1104 of the other ASIC 1102; and receive configuration data from the connection block 1104 of the other ASIC 1102 to provide to the microcontroller 112 of the respective ASIC 1102.

As illustrated, each connection block 1104 includes connection hardware of a packet injector 1106, serializer/deserializer ("SER/DES") hardware 1110, a link controller 1108, and signal select hardware 106. The packet injector 1106 is coupled to the microcontroller 112, for instance using a register interface to one or more status registers in the memory 114 of the microcontroller 112. The SER/DES hardware 1110 of each connection block 1104 serves as at least part of a hardware coupling between the ASICs 1102. The hardware coupling may facilitate a high-speed link (not shown) between ASICs 1102. The link controller 1108 couples between the packet injector 1106, the SER/DES hardware 1110, and the signal select hardware 106 and may control transmission of data over the SER/DES hardware 1110 connections. The signal select hardware 106 may be implemented as described by reference to FIG. 1, the output of which is multiplexed onto the bus 508.

During operation of the system 1100, the microcontrollers 112 may use the packet injectors 1106 to communicate data about the logic 104 of the respective ASIC 1102 to the other ASIC 1102. The receiving ASIC 1102 may use its signal select hardware 106 to communicate the received data to its signal analysis hardware 108 over the bus 508. If the signal analysis hardware 108 detects that a monitored condition has occurred on the other ASIC 1102, the signal analysis hardware 108 may interrupt the microcontroller 112 using interrupt data 510 to process the condition and responsively reconfigured the logic 104 as needed.

Figure 12:
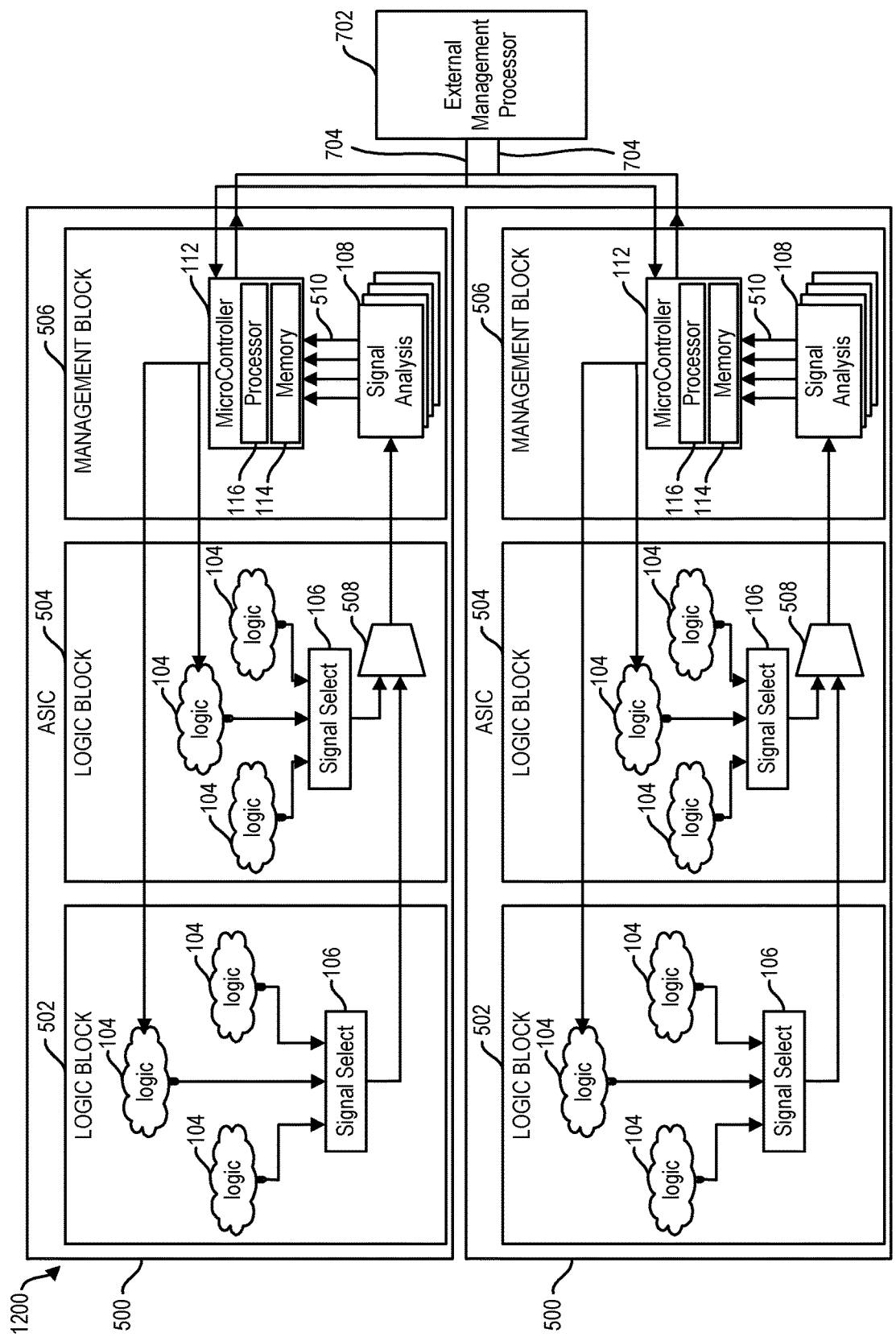
FIG. 12 depicts a system that includes multiple programmable integrated circuits with diagnostic hardware, according to one or more examples of the present disclosure.

FIG. 12 depicts a system 1200 that includes two programmable ASICs 500 (as illustrated in FIG. 5) communicatively coupled to a management processor 702 that is external to the ASICs 500. As shown, a hardware interface 704 couples the microcontrollers 112 and the external management processor 702. In an example, the hardware interface 704 includes a connection between GPIO pins (not shown) included on the microcontrollers 112 and the external management processor 702 to coordinate configuring the logic 104 across both ASICs 500.

Figure 13:
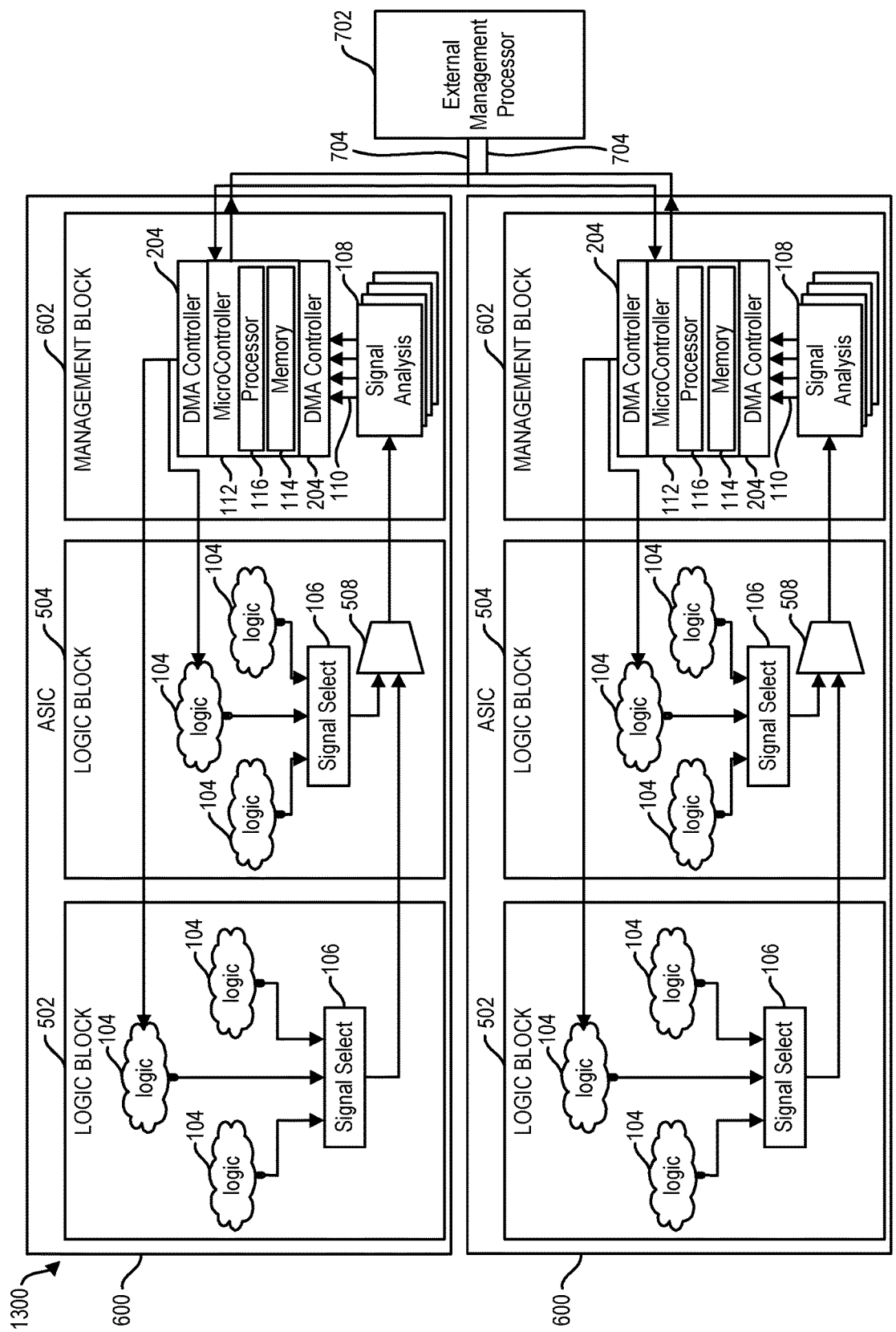
FIG. 13 depicts a system that includes multiple programmable integrated circuits with diagnostic hardware, according to one or more examples of the present disclosure.

FIG. 13 depicts a system 1300 that includes two programmable ASICs 600 (as illustrated in FIG. 6) communicatively coupled to a management processor 702 that is external to the ASICs 600. As shown, a hardware interface 704 couples the microcontrollers 112 and the external management processor 702. In an example, the hardware interface 704 includes a connection between GPIO pins (not shown) included on the microcontrollers 112 and the external management processor 702 to coordinate configuring the logic 104 across both ASICs 600.

Figure 14:
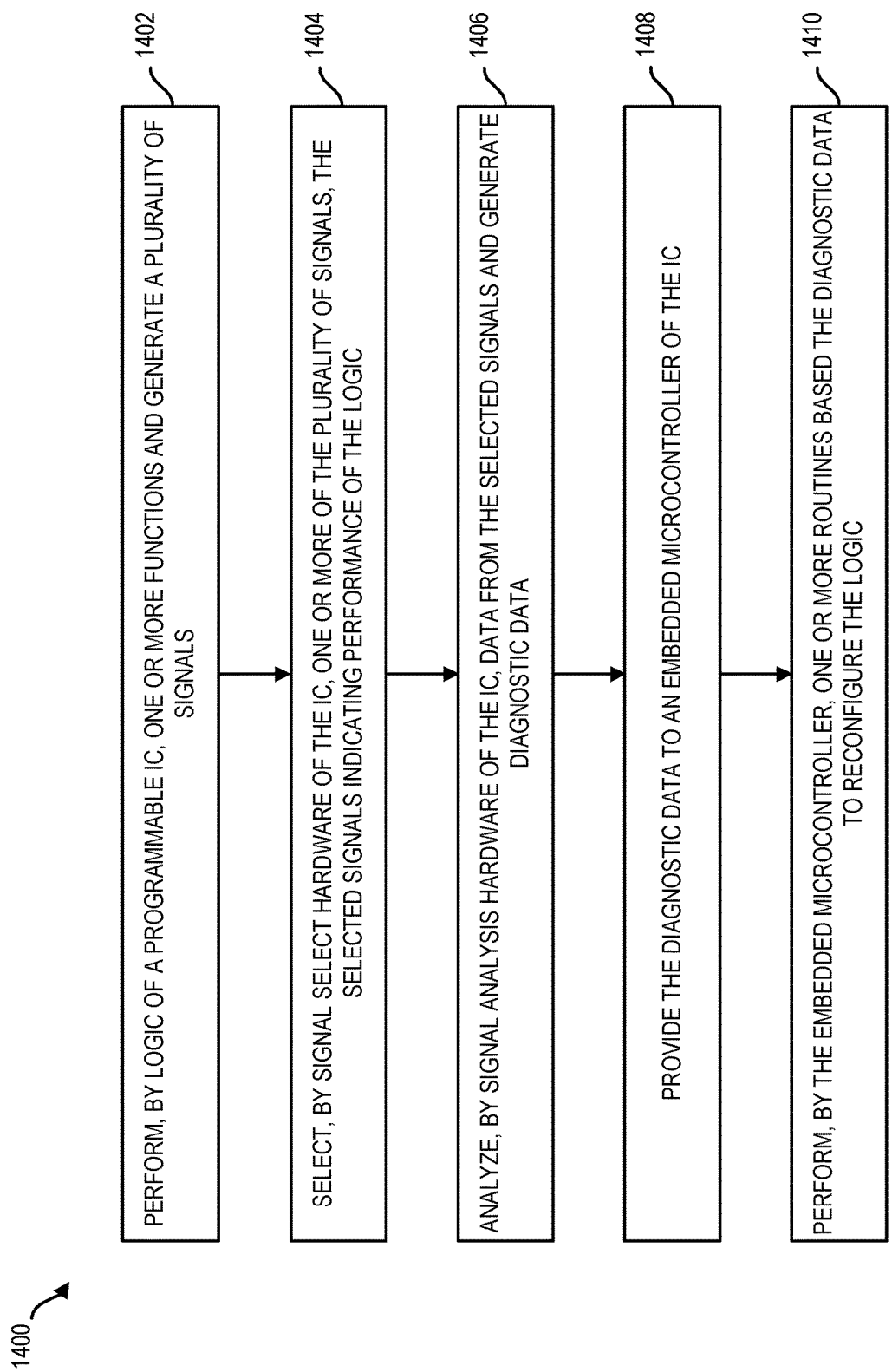
FIG. 14 depicts a flow diagram of a method for performing internal diagnostics for a programmable integrated circuit, according to one or more examples of the present disclosure.

FIG. 14 depicts a flow diagram of a method 1400 for performing internal diagnostics for a programmable integrated circuit, according to one or more examples of the present disclosure. Method 1400 may be implemented by one or a combination of the ASICs and/or systems depicted in and described by reference to FIGS. 1-13. In accordance with the method 1400, logic 104 of an IC performs (1402) one or more functions and generates a plurality of signals. Signal select hardware 106 of the IC selects (1404) one or more of the plurality of signals. The selected signals indicate performance of the logic 104. Signal analysis hardware 108 analyzes (1406) data from the selected signals and generates diagnostic data, which it provides (1408) to an embedded microcontroller 112 of the IC. The diagnostic data may be stored to one or more status registers 110 accessible to the microcontroller or provided directly into memory 114 of the microcontroller 112. Alternatively, the diagnostic data may be provided as interrupt data over a direct connection to the microcontroller 112. Upon receipt of the diagnostic data, the embedded microcontroller performs (1410) one or more routines based on the diagnostic data to reconfigure the logic 104.

As earlier described, FIGS. 3-8 depict example ICs, in this case ASICs, 300-800 that include: a first integrated circuit block having a first part of the logic 104 and a first part of the signal select hardware 106; a second integrated circuit block having a second part of the logic 104 and a second part of the signal select hardware 106; and a third integrated circuit block communicatively coupled to the first and second integrated circuit blocks and including the embedded microcontroller 112.

For the example ICs 300, 700 depicted in FIGS. 3 and 7: the first integrated circuit block further includes a first part of the programmable signal analysis hardware 108; the second integrated circuit block further comprises a second part of the programmable signal analysis hardware 108; and the hardware interface includes a first status register 110, included on the first integrated circuit block, to record a first part of the diagnostic data for access by the embedded microcontroller 112 and a second status register 110, included on the second integrated circuit block, to record a second part of the diagnostic data for access by the embedded microcontroller 112.

For the example ICs 400, 800 depicted in FIGS. 4 and 8: the first integrated circuit block further includes a first part of the programmable signal analysis hardware 108; the second integrated circuit block further includes a second part of the programmable signal analysis hardware 108; and the hardware interface includes a direct memory access controller 204, included on the third integrated circuit block, to write the diagnostic data to memory 114 of the embedded microcontroller 112.

For the example ICs 500, 600 depicted in FIGS. 5 and 6, the third integrated circuit block further includes the programmable signal analysis hardware 108, and the programmable integrated circuit further includes a bus 508 to provide the selected signals to the programmable signal analysis hardware 108.

For the example IC 500 depicted in FIG. 5, the diagnostic data includes interrupt data 510, and the hardware interface comprises a direct connection between the programmable signal analysis hardware 108 and the embedded microcontroller 112 to transport the interrupt data 510.

For the example ICs 700, 800 depicted in FIGS. 7 and 8, the embedded microcontroller 112 includes an interface 704 to couple to a management processor 702 that is external to the programmable integrated circuit.

As earlier described, FIGS. 9-13 depict example systems 900-1300 that include a plurality of programmable integrated circuits, illustrated as ASIC, with each programmable integrated circuit containing: hardware to communicatively couple to at least one other programmable integrated circuit; one or more logic blocks including logic 104 to perform one or more functions, wherein the logic 104 outputs a plurality of signals, and signal select hardware 106 to select one or more of the signals output from the logic 104; a management block communicatively coupled to the one or more logic blocks and containing at least an embedded microcontroller 112 to receive diagnostic data and reconfigure the logic 104 based on the diagnostic data; and programmable signal analysis hardware 108 to analyze the selected signals and generate the diagnostic data.

For the systems 900-1300 depicted in FIGS. 9-13, each management block further includes the respective programmable signal analysis hardware 108.

For the systems 900-1300 depicted in FIGS. 9-13, each programmable integrated circuit further includes a bus 508 to provide the selected signals to the programmable signal analysis hardware 108.

For the systems 900, 1000 depicted in FIGS. 9 and 10, the hardware to communicatively couple to at least one other programmable integrated circuit includes a microcontroller interface 902 to couple to at least one other microcontroller interface 902.

For the systems 1200, 1300 depicted in FIGS. 12 and 13, the hardware to communicatively couple to at least one other programmable integrated circuit includes a microcontroller interface 704 to couple to a management processor 702 that is external to the programmable integrated circuit.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A programmable integrated circuit comprising:
   logic to perform one or more functions, wherein the logic outputs a plurality of signals;
   signal select hardware to select one or more of the signals output from the logic;
   programmable signal analysis hardware to analyze the selected signals to produce diagnostic data;
   an embedded microcontroller to receive the diagnostic data from the programmable signal analysis hardware and reconfigure the logic based on the diagnostic data; and
   a hardware interface connecting the programmable signal analysis hardware and the embedded microcontroller to transport the diagnostic data from the programmable signal analysis hardware to the embedded microcontroller.

2. The programmable integrated circuit of claim 1, wherein the hardware interface comprises a status register to record the diagnostic data for access by the embedded microcontroller.

3. The programmable integrated circuit of claim 1, wherein:
   the embedded microcontroller includes a memory; and
   the hardware interface comprises a direct memory access controller to write the diagnostic data to memory of the embedded microcontroller.

4. The programmable integrated circuit of claim 3, further comprising a second direct memory access controller to couple the embedded microcontroller to the logic to provide code from the memory of the embedded microcontroller to reconfigure the logic based on the diagnostic data.

5. The programmable integrated circuit of claim 1, further comprising:
   a first integrated circuit block comprising a first part of the logic and a first part of the signal select hardware;
   a second integrated circuit block comprising a second part of the logic and a second part of the signal select hardware; and
   a third integrated circuit block communicatively coupled to the first and second integrated circuit blocks, the third integrated circuit block comprising the embedded microcontroller.

6. The programmable integrated circuit of claim 5, wherein:
   the first integrated circuit block further comprises a first part of the programmable signal analysis hardware;
   the second integrated circuit block further comprises a second part of the programmable signal analysis hardware; and
   the hardware interface comprises:
      a first status register, included on the first integrated circuit block, to record a first part of the diagnostic data for access by the embedded microcontroller; and
      a second status register, included on the second integrated circuit block, to record a second part of the diagnostic data for access by the embedded microcontroller.

7. The programmable integrated circuit of claim 5, wherein:
the first integrated circuit block further comprises a first part of the programmable signal analysis hardware;
the second integrated circuit block further comprises a second part of the programmable signal analysis hardware; and
the hardware interface comprises a direct memory access controller, included on the third integrated circuit block, to write the diagnostic data to memory of the embedded microcontroller.

8. The programmable integrated circuit of claim 5, wherein the third integrated circuit block further comprises the programmable signal analysis hardware, and the programmable integrated circuit further comprises:
a bus to provide the selected signals to the programmable signal analysis hardware.

9. The programmable integrated circuit of claim 8, wherein the diagnostic data comprises interrupt data, and the hardware interface comprises a direct connection between the programmable signal analysis hardware and the embedded microcontroller to transport the interrupt data.

10. The programmable integrated circuit of claim 5, wherein the embedded microcontroller comprises an interface to couple to a management processor that is external to the programmable integrated circuit.

11. A system comprising:
a plurality of programmable integrated circuits, each programmable integrated circuit comprising:
hardware to communicatively couple to at least one other programmable integrated circuit;
one or more logic blocks comprising:
logic to perform one or more functions, wherein the logic outputs a plurality of signals; and
signal select hardware to select one or more of the signals output from the logic;
a management block communicatively coupled to the one or more logic blocks, the management block comprising an embedded microcontroller to receive diagnostic data and reconfigure the logic based on the diagnostic data; and
programmable signal analysis hardware to analyze the selected signals and generate the diagnostic data.

12. The system of claim 11, wherein each management block further comprises the respective programmable signal analysis hardware.

13. The system of claim 12, wherein each programmable integrated circuit further comprises:
a bus to provide the selected signals to the programmable signal analysis hardware.

14. The system of claim 11, wherein the hardware to communicatively couple to at least one other programmable integrated circuit comprises a microcontroller interface to couple to at least one other microcontroller interface.

15. The system of claim 11, wherein the hardware to communicatively couple to at least one other programmable integrated circuit comprises a microcontroller interface to couple to a management processor that is external to the programmable integrated circuit.

16. The system of claim 11, wherein each programmable integrated circuit further comprises:
a connection block comprising the hardware to communicatively couple to at least one other programmable integrated circuit.

17. The system of claim 16, wherein the hardware on the connection block comprises connection hardware to:
receive configuration data from the microcontroller of the respective programmable integrated circuit to provide to the connection block of the at least one other programmable integrated circuit; and
receive configuration data from the connection block of the at least one other programmable integrated circuit to provide to the microcontroller of the respective programmable integrated circuit.

18. A method for performing internal diagnostics for a programmable integrated circuit, the method comprising:
performing, by logic of the programmable integrated circuit, one or more functions and generating a plurality of signals;
selecting, by signal select hardware of the programmable integrated circuit, one or more of the plurality of signals, the selected signals indicating performance of the logic;
analyzing, by signal analysis hardware of the programmable integrated circuit, data from the selected signals and generating diagnostic data;
providing the diagnostic data to an embedded microcontroller of the programmable integrated circuit; and
performing, by the embedded microcontroller, one or more routines based on the diagnostic data to reconfigure the logic.

19. The method of claim 18, wherein the diagnostic data is one of:
provided into one or more status registers accessible to the embedded microcontroller; or
provided directly into a memory of the embedded microcontroller.

20. The method of claim 18, wherein the diagnostic data is provided to the embedded microcontroller as interrupt data over a direct connection between the signal analysis hardware and the embedded microcontroller.

* * * * *